United States Patent
Si et al.

(10) Patent No.: US 12,135,346 B2
(45) Date of Patent: Nov. 5, 2024

(54) MULTI-DIMENSIONAL ANALYSIS METHOD FOR TRIPPING RISK OF WHOLE TRANSMISSION LINE DUE TO LIGHTNING SHIELDING FAILURE

(71) Applicants: STATE GRID ZHEJIANG ELECTRIC POWER CO., LTD. TAIZHOU POWER SUPPLY COMPANY, Zhejiang (CN); Taizhou Hongda Electric Power Construction Co., Ltd., Zhejiang (CN)

(72) Inventors: Jiandong Si, Zhejiang (CN); Feng Guo, Zhejiang (CN); Jian Yang, Zhejiang (CN); Yiqin Tang, Zhejiang (CN); Bin Tang, Zhejiang (CN); Jun Liu, Zhejiang (CN); Wenhui Li, Zhejiang (CN); Chengshi Zeng, Zhejiang (CN); Xin Lv, Zhejiang (CN); Jianguo Pan, Zhejiang (CN); Guanglei Wan, Zhejiang (CN); Qiuxiao Wang, Zhejiang (CN); Kang Wang, Zhejiang (CN); Xu Jiang, Zhejiang (CN); Huan Liu, Zhejiang (CN); Junzhe Liang, Zhejiang (CN)

(73) Assignees: STATE GRID ZHEJIANG ELECTRIC POWER CO., LTD. TAIZHOU POWER SUPPLY COMPANY, Taizhou (CN); Taizhou Hongda Electric Power Construction Co., Ltd., Taizhou (CN)

( * ) Notice: Subject to any disclaimer, the term of this patent is extended or adjusted under 35 U.S.C. 154(b) by 253 days.

(21) Appl. No.: 17/781,721

(22) PCT Filed: Dec. 3, 2021

(86) PCT No.: PCT/CN2021/135293
§ 371 (c)(1),
(2) Date: Jun. 2, 2022

(87) PCT Pub. No.: WO2022/127616
PCT Pub. Date: Jun. 23, 2022

(65) Prior Publication Data
US 2023/0243883 A1 Aug. 3, 2023

(30) Foreign Application Priority Data
Dec. 18, 2020 (CN) .......................... 202011508929.7

(51) Int. Cl.
*G01R 31/08* (2020.01)
*G01R 31/00* (2006.01)

(52) U.S. Cl.
CPC ......... *G01R 31/085* (2013.01); *G01R 31/003* (2013.01)

(58) Field of Classification Search
CPC ................ G01R 31/085; G01R 31/003; G01R 31/1245; Y04S 10/50; G06Q 10/0635; G06Q 50/06; G06F 17/15; G06F 17/18
See application file for complete search history.

(56) References Cited

U.S. PATENT DOCUMENTS

2010/0286954 A1* 11/2010 Chen .................. G01D 21/00
702/179

FOREIGN PATENT DOCUMENTS

| CN | 110865269 A | * | 3/2020 | ........... G01R 31/003 |
| CN | 111695775 A | | 9/2020 | |
| CN | 111751638 A | * | 10/2020 | ........... G01R 31/003 |

OTHER PUBLICATIONS

Code for design of overvoltage protection and insulation coordination for AC electrical installations, National Standards of the People's Republic of China, Mar. 31, 2014, GB/T 50064-2014.
(Continued)

*Primary Examiner* — Feba Pothen

(57) ABSTRACT

Disclosed is a multi-dimensional analysis method for a tripping risk of a whole transmission line due to a lightning
(Continued)

shielding failure. A quantity of thunderstorm days, a tower size, a terrain proportion, an altitude, and insulation configuration data are collected for a transmission line for which a tripping risk due to a lightning shielding failure needs to be analyzed, and a striking distance, an exposure distance, a lightning resisting level of the line after altitude factor correction, and a lightning shielding failure risk of a single-base tower are calculated in turn. Characteristics of a lightning shielding failure under different nominal heights, quantities of thunderstorm days, and terrains are studied. Representative combination conditions are selected to calculate a tripping risk of a typical tower due to the lightning shielding failure. A weight coefficient is extracted, to calculate a tripping risk of the whole line due to the lightning shielding failure.

4 Claims, 6 Drawing Sheets

(56) References Cited

OTHER PUBLICATIONS

Xing Li et al., The Improved EGM Model-Based Calculation Method for Shielding Failure Trip-out Rate of Multi-circuit Transmission Lines at the Same Tower, Southern Power System Technology, Apr. 30, 2013, pp. 55-59, vol. 7, No. 4.

* cited by examiner

MULTI-DIMENSIONAL ANALYSIS METHOD FOR TRIPPING RISK OF WHOLE TRANSMISSION LINE DUE TO LIGHTNING SHIELDING FAILURE

TECHNICAL FIELD

The present disclosure relates to the technical field of electric power engineering, and specifically, to a risk assessment technology of a power system.

BACKGROUND

In recent years, as a transmission voltage level of a line increases, a transmission tower becomes higher, and a long-span transmission line crosses a plateau, a mountainous area, and other areas with serious lightning damages, line tripping caused by a lightning shielding failure on the line has gradually become a main cause for tripping of a power grid. Frequent line tripping caused by the lightning shielding failure on the line greatly affects reliability and quality of power supply. Outage and emergency operation and maintenance cause an economic loss and increase operation and maintenance costs. In order to carry out differentiated operation and maintenance on a weak link of lightning protection of the transmission line and improve a capability against the lightning shielding failure for the line, an effective analysis method for a tripping risk of the whole transmission line due to the lightning shielding failure should be established to provide guidance for line construction and operation and maintenance.

At present, there is no accurate and reliable assessment means for a lightning shielding failure risk of the whole line. Standard methods have large errors in calculating a lightning shielding failure probability of the transmission line, and does not consider influence of an altitude, a terrain, a lightning strike angle, and other factors thoroughly or make corresponding correction. In addition, the prior art can only analyze and calculate a lightning shielding failure risk of a transmission line on a specific tower. Because the whole transmission line is characterized by a long span, diverse terrains, and different combinations of nominal height, calculating the lightning shielding failure risk of the whole transmission line by analyzing and calculating a lightning shielding failure risk of each tower on the whole transmission line is not feasible and results in a huge amount of calculation.

Therefore, how to correct a model based on the factors such as the altitude, the terrain, and the lightning strike angle, comprehensively and objectively reflect a rule of affecting the power system by a natural disaster when information about terrains, nominal heights, and thunderstorm quantities of different sections of the line cannot be collected completely, and analyze a tripping risk of the whole transmission line due to the lightning shielding failure is of great significance to reduce tripping of the power grid due to the lightning shielding failure.

SUMMARY

A technical problem to be resolved in the present disclosure is to provide a multi-dimensional analysis method for a tripping risk of a whole transmission line due to a lightning shielding failure, to consider more comprehensive factors and analyze a tripping risk of a whole transmission line due to a lightning shielding failure more accurately.

To resolve the above technical problem, the present disclosure adopts the following technical solution: A multi-dimensional analysis method for a tripping risk of a whole transmission line due to a lightning shielding failure includes the following steps:

step 1: extracting a size parameter of a main tower head, an insulation configuration for a line, a quantity of monitored thunderstorm days, and an average altitude for the line, and calculating a ground wire protection angle, a striking distance, and a corrected insulator flashover voltage;

step 2: setting an analysis group based on the protection angle, a terrain, a nominal height, and the quantity of thunderstorm days, and calculating a lightning shielding failure risk value of the line in each case based on a shielding principle of the transmission line;

step 3: analyzing, based on a calculation result in step 2, a main factor affecting a lightning shielding failure risk of the line, and selecting a typical combination of a tower protection angle, the terrain, the nominal height, and the quantity of thunderstorm days based on an existing terrain proportion or a ground wire protection angle setting collected for the transmission line; and step 4: extracting a weight of the selected typical combination of the tower protection angle, the terrain, the nominal height, and the quantity of thunderstorm days in step 3 based on a terrain proportion and tower usage of a whole line in a same area, and performing a quantitative analysis on a tripping risk of the whole line due to a lightning shielding failure.

Preferably, the calculating a ground wire protection angle, a striking distance, and a corrected insulator flashover voltage in step 1 includes the following steps:

step 1.1: calculating the ground wire protection angle according to the following formula, where the ground wire protection angle reflects a spatial position relationship between a conductor and a ground wire, and is determined by a spacing between tower crossarms, a length of a crossarm, an insulator string configuration, and a ground wire support:

$$\theta = \arctan\left(\frac{S_C - S_G}{h_1 + h_G - l_G + l_C}\right)$$

where $S_C$ represents a length of a crossarm of the conductor, $S_G$ represents a length of a crossarm of the ground wire, $h_1$ represents a distance between the crossarm of the conductor and the ground wire support, $h_G$ represents a height of the ground wire support, $l_G$ represents a length of a ground wire string, and $l_C$ represents a length of a conductor string;

step 1.2: calculating striking distances of the conductor, the ground wire, and the ground according to the following formulas, where the striking distance is a critical breakdown distance between a head of a lightning charge leader in the air and a ground struck by lightning, or between the head of the lightning charge leader in the air and an object on the ground, a higher potential of the head of the leader leads to a longer striking distance, and a potential is determined by a lightning current amplitude:

$$r_s = 10I^{0.65}$$

$$r_c = 1.63(5.015I^{0.578} - 0.001U_{DC})^{1.125}$$

$$r_g = \begin{cases} [3.6 + 1.7\ln(43 - h_{c \cdot av})]I^{0.65} & h_{c \cdot av} < 40 \text{ m} \\ 5.5I^{0.65} & h_{c \cdot av} \geq 40 \text{ m} \end{cases}$$

where $r_s$ represents a striking distance between the leader and the ground wire, I represents the lightning current amplitude, $r_c$ represents a striking distance between the leader and the conductor, $U_{DC}$ represents a voltage level of the transmission line, $r_g$ represents a striking distance between the leader and the ground, and $h_{c \cdot av}$ represents an average height of the conductor relative to the ground; and step 1.3: introducing an altitude correction factor, where the insulator flashover voltage is a key index for determining whether a flashover tripping occurs, no flashover occurs when insulation performance is good enough to withstand lightning impulse, and the insulator flashover voltage is affected by the altitude;

$$U_{50\%} = (533L + 132)\frac{1}{1.1 - H/10000}$$

where L represents a dry-arcing distance of an insulator, H represents the altitude, and $U_{50\%}$ represents an absolute value of 50% flashover voltage of the insulator.

Preferably, the lightning current amplitude is calculated according to a recommended probability of the lightning current amplitude in GB/T50064-2014 Code for Design of Overvoltage Protection and Insulation Coordination for AC Electrical Installations and the following formulas:

where when the quantity of thunderstorm days is greater than 20, the following formula is used:

$$P(I_0 \geq i_0) = 10^{-\frac{i_0}{88}}$$

when the quantity of thunderstorm days is less than or equal to 20, the following formula is used:

$$P(I_0 \geq i_0) = 10^{-\frac{i_0}{44}}$$

where $P(I_0 \geq i_0)$ represents a probability that the lightning current amplitude exceeds $i_0$, $I_0$ represents a variable of the lightning current amplitude, and $i_0$ represents a given lightning current amplitude.

Preferably, a tripping risk of the typical combination of the tower protection angle, the terrain, the nominal height, and the quantity of thunderstorm days due to the lightning shielding failure is calculated and analyzed based on a discharge mechanism of the lightning leader and an equivalence circuit diagram of the lightning shielding failure, which specifically includes the following steps:

step 3.1: fitting a probability distribution of a lightning strike angle according to the following formula, where an occurrence mechanism of the lightning shielding failure on the line shows that the strike angle is randomly distributed when the lightning charge leader reaches near the line:

$$g(\psi) = K_m \cos^m(\psi)$$

where $g(\psi)$ represents a probability that the strike angle of the lightning charge leader is $\psi$; $K_m$ represents a normalization coefficient and needs to meet the following formula:

$$\int_{-\frac{\pi}{2}}^{\frac{\pi}{2}} g(\psi) d\psi = 1;$$

and m may represent 1, 2, . . . ;

step 3.2: obtaining an exposure arc of the conductor based on an exposure circle within a ground wire protection range and a striking distance protection range of the ground, and then calculating an exposure distance of the conductor according to the following formula, where the lightning shielding failure occurs on the line when the lightning charge leader is in the exposure arc of the conductor, the exposure arc is a length of the line exposed to lightning, and the exposure circle is a circle centered on the conductor and with a radius being a striking distance of the conductor:

$$X = \int_{\theta_1}^{\theta_2} \int_{\psi_1(\theta)}^{\psi_2(\theta)} \frac{r_s \sin(\theta - \psi)}{\cos\psi} g(\psi) d\psi d\theta$$

where $\theta_1$ represents a horizontal included angle at an intersection point of the ground protection range and the exposure circle of the conductor, $\theta_2$ represents a horizontal included angle at an intersection point of the ground wire protection range and the exposure circle of the conductor, $\psi_1(\theta)$ represents a minimum included angle of a horizontal included angle of a leading process of lightning, and $\psi_2(\theta)$ represents a maximum included angle of a horizontal included angle of a leading process of lightning;

step 3.3: analyzing a lightning resisting level of line insulation by using an equivalent circuit of the lightning shielding failure of which wave impedance of the conductor is connected in series to a voltage source of the line and then connected in parallel to wave impedance of a lightning channel, and calculating, according to the following formula, a lightning voltage applied to a discharge channel at the moment of the lightning shielding failure:

$$U_A = \frac{Z_0}{Z + 2Z_0}(IZ + 2U_{AC})$$

where $Z_0$ represents the wave impedance of the lightning channel, Z represents the wave impedance of the conductor, I represents a lightning current amplitude, $U_{AC}$ represents a voltage of the transmission line to the ground, and $U_A$ represents the lightning voltage applied to the discharge channel; and there is a corresponding relationship between equivalent wave impedance of the lightning channel and the lightning current amplitude, $Z_0$ is obtained based on a characteristic curve of the equivalent wave impedance of the lightning channel and the lightning current amplitude after the lightning current amplitude is determined, and the lightning resisting level is calculated based on an occurrence criterion of the lightning shielding failure, where the lightning shielding failure occurs when $U_A \geq U_{50\%}$:

$$I_c \geq \frac{Z+2Z_0}{Z_0 Z}\left(U_{50\%} - \frac{2Z_0 U_{AC}}{Z+2Z_0}\right).$$

step 3.4: calculating the lightning shielding failure risk value of the line in each case of the typical combination according to the shielding principle of the transmission line and the following formula:

$$SFF = \frac{2N_g}{10}\int_{I_C}^{I_{max}} XP'(I)dI$$

where $N_g$ represents a ground flash density in this area, X represents the exposure distance of the conductor, I represents the lightning current amplitude, $I_c$ represents a lightning resisting level of the transmission line, and $I_{max}$ represents an upper limit of the lightning current amplitude; and sorting the lightning shielding failure risk value of the line in each case of the typical combination to obtain a high-risk typical combination.

Preferably, in step 4, the tripping risk of the whole line due to the lightning shielding failure is analyzed through weighted averaging of the typical combination:

$$SFF_{eq} = \sum_{j=1}^{4}\beta_j\left(\sum_{i=1}^{4}\alpha_i SFF_{\varphi_i,h_j}^{\theta}\right)$$

where $h_j$ represents a height of a $j^{th}$ type of tower; $\beta_j$ represents a proportion of a tower whose nominal height is $h_j$; $SFF_{\varphi_i,h_j}^{\theta}$ represents a lightning shielding failure risk when the tower protection angle is $\theta$, the nominal height is $h_j$, and an inclination angle of the ground is $\varphi_i$; $\alpha_i$ represents a proportion of a section corresponding to a terrain whose inclination angle of the ground is $\varphi_i$ to the whole line; and $SFF_{eq}$ represents the lightning shielding failure risk of the whole line.

The technical solution adopted in the present disclosure has the following beneficial effects:

1. Altitude correction and terrain influence are considered in the lightning shielding failure calculation model, and more comprehensive factors are considered.

2. The analysis method proposed in the present disclosure can obtain the high-risk typical combination of the nominal height, the terrain, the quantity of thunderstorm days, and the protection angle through analysis, and identify a weak link of the whole line.

3. The analysis method proposed in the present disclosure can quickly analyze the tripping risk of the whole line due to the lightning shielding failure through weighted averaging of the typical combination, without massive calculation for a tower analysis of the whole line, so as to provide an effective suggestion for lightning protection of the line.

The specific technical solution in the present disclosure and its beneficial effects will be described in detail in the following specific implementations with reference to the accompanying drawings.

BRIEF DESCRIPTION OF THE DRAWINGS

The present disclosure is further described below with reference to the accompanying drawings and specific implementations.

DETAILED DESCRIPTION

The technical solutions of the embodiments of the present disclosure are clearly and completely described below with reference to the accompanying drawings in the embodiments of the present disclosure. Apparently, the described embodiments are merely a part rather than all of the embodiments of the present disclosure. The following description of at least one exemplary embodiment is merely illustrative, and not intended to limit the present disclosure and application or use thereof in any way. All other embodiments obtained by a person of ordinary skill in the art based on the embodiments of the present disclosure without creative efforts shall fall within the protection scope of the present disclosure.

Figure 1:
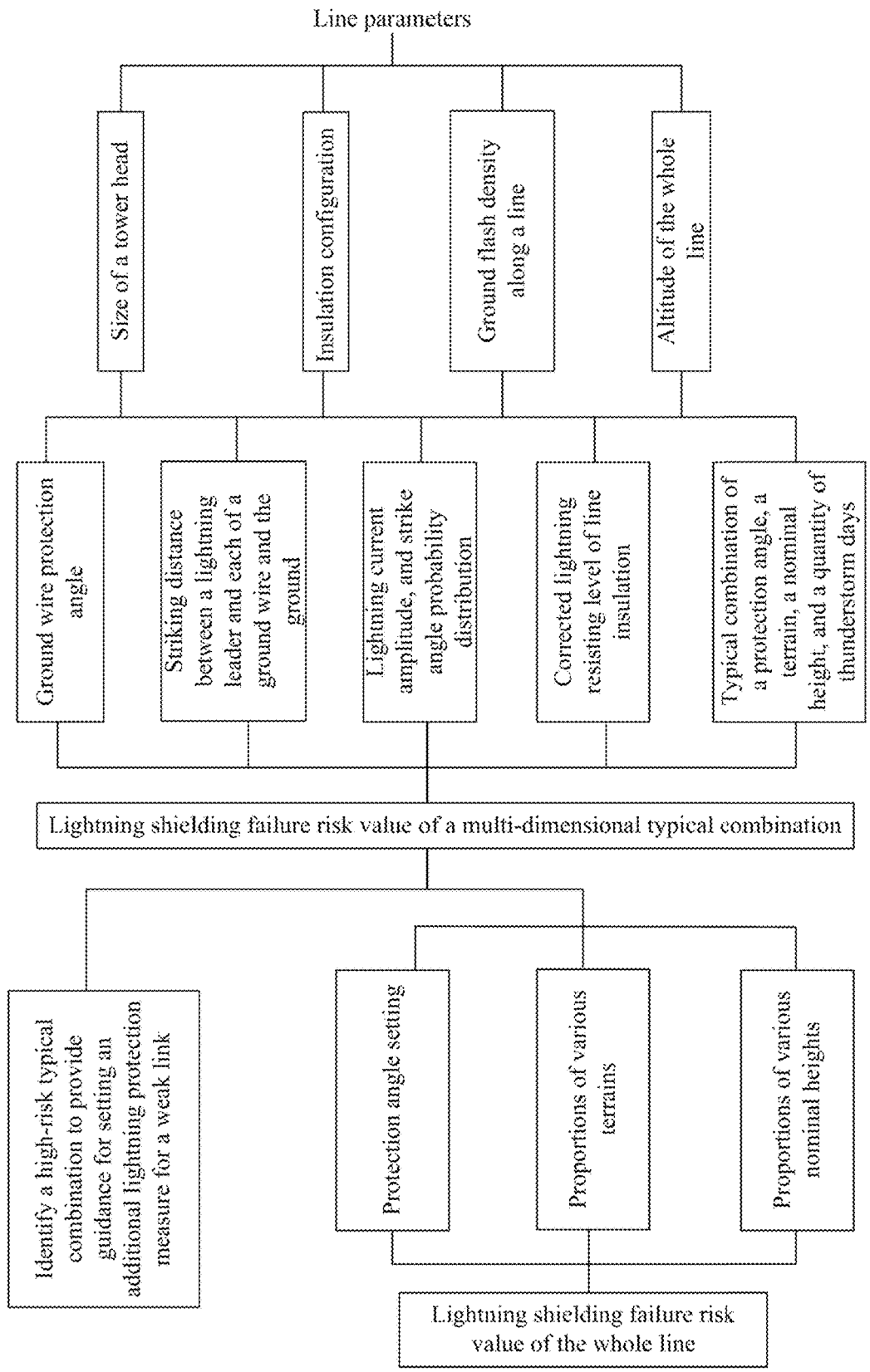
FIG. 1 is a flowchart according to the present disclosure.

As shown in FIG. 1, the present disclosure provides a multi-dimensional analysis method for a tripping risk of a whole transmission line due to a lightning shielding failure. The method specifically includes the following steps.

Step 1: Extract a size parameter of a main tower head, an insulation configuration for a line, a quantity of monitored thunderstorm days, and an average altitude for the line, and calculating a ground wire protection angle, a striking distance, and a corrected insulator flashover voltage.

The main tower head herein is a tower head with a largest quantity and a highest proportion, which is preferably selected and used based on a quantity of each type of tower head used during construction and statistical data.

Step 1.1: Calculate the ground wire protection angle according to the following formula, where the ground wire protection angle reflects a spatial position relationship between a conductor and a ground wire, and is determined by a spacing between tower crossarms, a length of a crossarm, an insulator string configuration, and a ground wire support:

$$\theta = \arctan\left(\frac{S_C - S_G}{h_1 + h_G - l_G + l_C}\right)$$

In the above formula, $S_C$ represents a length of a crossarm of the conductor, $S_G$ represents a length of a crossarm of the ground wire, $h_1$ represents a distance between the crossarm of the conductor and the ground wire support, $h_G$ represents a height of the ground wire support, $l_G$ represents a length of a ground wire string, and $l_C$ represents a length of a conductor string.

Step 1.2: Calculate striking distances of the conductor, the ground wire, and the ground according to the following formulas, where the striking distance is a critical breakdown distance between a head of a lightning charge leader in the air and a ground struck by lightning, or between the head of the lightning charge leader in the air and an object on the ground, a higher potential of the head of the leader leads to a longer striking distance, and a potential is determined by a lightning current amplitude:

$$r_s = 10I^{0.65}$$

$$r_c = 1.63(5.015I^{0.578} - 0.001U_{DC})^{1.125}$$

$$r_g = \begin{cases} [3.6 + 1.7\ln(43 - h_{c.av})]I^{0.65} & h_{c.av} < 40m \\ 55I^{0.65} & h_{c.av} \geq 40m \end{cases}$$

In the above formula, $r_s$ represents a striking distance between the leader and the ground wire, I represents the lightning current amplitude, $r_e$ represents a striking distance between the leader and the conductor, $U_{DC}$ represents a voltage level of the transmission line, $r_g$ represents a striking distance between the leader and the ground, and $h_{c.av}$ represents an average height of the conductor relative to the ground.

The lightning current amplitude is calculated according to a recommended probability of the lightning current amplitude in GB/T50064-2014 Code for Design of Overvoltage Protection and Insulation Coordination for AC Electrical Installations and the following formulas:

where when the quantity of thunderstorm days is greater than 20, the following formula is used:

$$P(I_0 \geq i_0) = 10^{-\frac{i_0}{88}}$$

when the quantity of thunderstorm days is less than or equal to 20, the following formula is used:

$$P(I_0 \geq i_0) = 10^{-\frac{i_0}{44}}$$

In the above formulas, $P(I_0 \geq i_0)$ represents a probability that the lightning current amplitude exceeds $i_0$, $I_0$ represents a variable of the lightning current amplitude, and $i_0$ represents a given lightning current amplitude.

Step 1.3: Introduce an altitude correction factor, where the insulator flashover voltage is a key index for determining whether a flashover tripping occurs, no flashover occurs when insulation performance is good enough to withstand lightning impulse, and the insulator flashover voltage is affected by the altitude:

$$U_{50\%} = (533L + 132)\frac{1}{1.1 - H/10000}$$

In the above formula, L represents a dry-arcing distance of an insulator, H represents the altitude, and $U_{50\%}$ represents an absolute value of 50% flashover voltage of the insulator.

Step 2: Set an analysis group based on the protection angle, a terrain, a nominal height, and the quantity of thunderstorm days, where because tower heights are diversified, and the ground wire protection angle has been set during line construction and is associated with the terrain, a typical combination can be extracted based on line parameters to analyze a lightning shielding failure risk value of the line in each case. For specific analysis, refer to step 3.

Step 3: Calculate and analyze a tripping risk of each typical combination due to the lightning shielding failure in step 2 based on an altitude correction parameter and terrain influence, and identify a weak link based on a quantitative risk value, where this step specifically includes the following steps:

Step 3.1: Fit a probability distribution of a lightning strike angle according to the following formula, where an occurrence mechanism of the lightning shielding failure on the line shows that the strike angle is randomly distributed when the lightning charge leader reaches near the line:

$$g(\psi) = K_m \cos^m(\psi)$$

In the above formula, $g(\psi)$ represents a probability that the strike angle of the lightning charge leader is $\psi$; and $K_m$ represents a normalization coefficient and needs to meet the following formula:

$$\int_{-\frac{\pi}{2}}^{\frac{\pi}{2}} g(\psi)d\psi = 1.$$

Step 3.2: Obtain an exposure arc of the conductor based on a circle centered on the conductor and with a radius being a striking distance of the conductor, within a ground wire protection range and a striking distance protection range of the ground, and then calculate an exposure distance of the conductor according to the following formula, where the lightning shielding failure occurs on the line when the lightning charge leader is in the exposure arc of the conductor:

$$X = \int_{\theta_1}^{\theta_2} \int_{\psi_1(\theta)}^{\psi_2(\theta)} \frac{r_s \sin(\theta - \psi)}{\cos\psi} g(\psi) d\psi d\theta$$

In the above formula, $\theta_1$ represents a horizontal included angle at an intersection point of the ground protection range and the exposure circle of the conductor, $\theta_2$ represents a horizontal included angle at an intersection point of the ground wire protection range and the exposure circle of the conductor, $\psi_1(\theta)$ represents a minimum included angle of a horizontal included angle of a leading process of lightning, and $\psi_2(\theta)$ represents a maximum included angle of a horizontal included angle of a leading process of lightning.

Step 3.3: Analyze a lightning resisting level of line insulation by using an equivalent circuit of the lightning shielding failure of which wave impedance of the conductor is connected in series to a voltage source of the line and then connected in parallel to wave impedance of a lightning channel, and calculate, according to the following formula, a lightning voltage applied to a discharge channel at the moment of the lightning shielding failure:

$$U_A = \frac{Z_0}{Z + 2Z_0}(IZ + 2U_{AC})$$

In the above formula, $Z_0$ represents the wave impedance of the lightning channel, Z represents the wave impedance of the conductor, I represents a lightning current amplitude, $U_{AC}$ represents a voltage of the transmission line to the ground, and $U_A$ represents the lightning voltage applied to the discharge channel.

There is a corresponding relationship between equivalent wave impedance of the lightning channel and the lightning current amplitude, $Z_0$ is obtained based on a characteristic curve of the equivalent wave impedance of the lightning channel and the lightning current amplitude after the lightning current amplitude is determined, and the lightning resisting level is calculated based on an occurrence criterion of the lightning shielding failure, where the lightning shielding failure occurs when $U_A \geq U_{50\%}$:

$$I_c \geq \frac{Z + 2Z_0}{Z_0 Z}\left(U_{50\%} - \frac{2Z_0 U_{AC}}{Z + 2Z_0}\right)$$

Step 3.4: Calculate the lightning shielding failure risk value of the line in each case of the typical combination according to the following formula:

$$SFF = \frac{2N_g}{10}\int_{I_C}^{I_{max}} XP'(I)dI$$

In the above formula, $N_g$ represents a ground flash density in this area, X represents the exposure distance of the conductor, I represents the lightning current amplitude, $I_c$ represents a lightning resisting level of the transmission line, and $I_{max}$ represents an upper limit of the lightning current amplitude.

The lightning shielding failure risk value of the line in each case of the typical combination is sorted to obtain a high-risk typical combination. In the line, a link whose nominal height, terrain, quantity of thunderstorm days, and protection angle are closer to the high-risk typical combination is the weak link, which is provided with an additional lightning protection measure.

Step 4: Extract a weight coefficient based on a terrain proportion, tower usage, and a protection angle setting of the whole line, and calculate a lightning shielding failure risk of the whole line according to the following formula, where a landform for tower construction is fixed, and proportions of various combinations of the protection angle, the terrain, the nominal height, and the quantity of thunderstorm days are fixed:

$$SFF_{eq} = \sum_{j=1}^{4}\beta_j\left(\sum_{i=1}^{4}\alpha_i SFF_{\varphi_i,h_j}^{\theta}\right)$$

In the above formula, $h_j$ represents a height of a $j^{th}$ type of tower; $\beta_j$ represents a proportion of a tower whose nominal height is $h_j$; $SFF_{\varphi_i,h_j}^{\theta}$ represents a lightning shielding failure risk when the tower protection angle is θ, the nominal height is $h_j$, and an inclination angle of the ground is $\varphi_i$; $\alpha_i$ represents a proportion of a section corresponding to a terrain whose inclination angle of the ground is $\varphi_i$ to the whole line; and $SFF_{eq}$ represents the lightning shielding failure risk of the whole line.

The following is a specific case of adopting the above method:

Based on operation statistics of a power grid from 2010 to 2019, and a typical combination of a protection angle, a terrain, a nominal height, and a quantity of thunderstorm days, a lightning shielding failure risk value of a line in each case of the typical combination is calculated and sorted to obtain a high-risk typical combination, and an additional lightning protection measure is set for a line section with a medium-risk or high-risk typical combination. In addition, a weight coefficient is extracted based on a situation of the whole line, and a lightning shielding failure risk of the whole line is analyzed.

Figure 2:
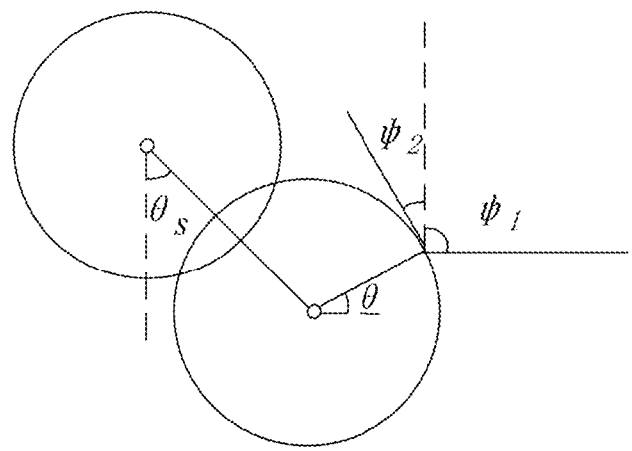
FIG. 2 is a diagram of calculating upper and lower limits of a strike angle of a leader according to the present disclosure.

A size parameter of a tower head and insulator string data are extracted for the line, and an analysis diagram of upper and lower limits of a strike angle of a leader is obtained based on a striking distance through calculation, as shown in FIG. 2.

Figure 3:
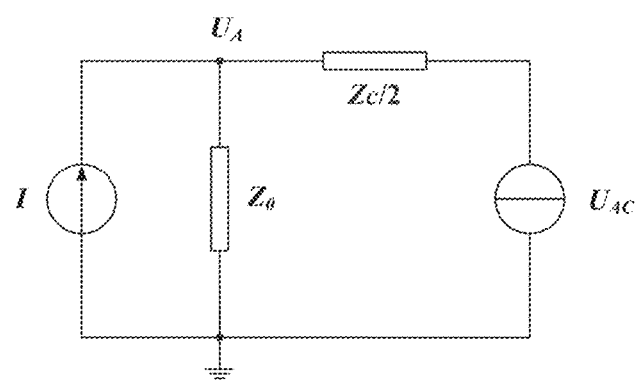
FIG. 3 is an equivalence circuit diagram of a conductor in the case of a shielding failure according to the present disclosure.

An equivalence circuit of a conductor in the case of a lightning shielding failure is constructed based on a discharge principle of the lightning leader, as shown in FIG. 3.

Table 1 lists lightning shielding failure risks calculated for typical combinations of different nominal heights, terrains, quantities of thunderstorm days, and protection angles.

TABLE 1

| | | | Lightning shielding failure risks of typical combinations | | | | | |
|---|---|---|---|---|---|---|---|---|
| | | Inclination angle of | Lightning shielding failure risk (times/(100 km · a)) | | | | | |
| Quantity of thunderstorm days (day) | Nominal height (m) | the ground (°) | Protection angle of 5° | Protection angle of 7° | Protection angle of 9° | Protection angle of 11° | Protection angle of 13° | Protection angle of 14° |
| 30 | 37 | 0 | 0 | 0 | 0 | 0 | 0 | 0 |
| | | 10 | 0 | 0 | 0.010845 | 0.047462 | 0.119061 | 0.171188 |
| | | 20 | 0.109767 | 0.192965 | 0.356084 | 0.583888 | 0.875287 | 1.043213 |
| | | 30 | 0.686452 | 0.914063 | 1.245777 | 1.612484 | 2.021004 | 2.242729 |
| | 40 | 0 | 0 | 0 | 0 | 0 | 0.008303 | 0.019788 |
| | | 10 | 0.01655 | 0.043835 | 0.108667 | 0.216996 | 0.378463 | 0.480861 |
| | | 20 | 0.329389 | 0.48139 | 0.738693 | 1.055986 | 1.418084 | 1.61105 |
| | | 30 | 1.098955 | 1.349473 | 1.717491 | 2.129874 | 2.590364 | 2.838832 |
| | 43 | 0 | 0 | 0.000621 | 0.012998 | 0.045843 | 0.106962 | 0.151141 |
| | | 10 | 0.121096 | 0.199502 | 0.348416 | 0.553782 | 0.8182 | 0.972204 |
| | | 20 | 0.688983 | 0.906273 | 1.240091 | 1.607658 | 2.012498 | 2.230198 |
| | | 30 | 1.538739 | 1.818591 | 2.23216 | 2.694026 | 3.202766 | 3.473407 |
| | 46 | 0 | 0.027771 | 0.058394 | 0.126116 | 0.232452 | 0.385165 | 0.480824 |
| | | 10 | 0.377874 | 0.528223 | 0.779417 | 1.088009 | 1.449618 | 1.643796 |

TABLE 1-continued

Lightning shielding failure risks of typical combinations

| Quantity of thunderstorm days (day) | Nominal height (m) | Inclination angle of the ground (°) | Lightning shielding failure risk (times/(100 km · a)) | | | | | |
|---|---|---|---|---|---|---|---|---|
| | | | Protection angle of 5° | Protection angle of 7° | Protection angle of 9° | Protection angle of 11° | Protection angle of 13° | Protection angle of 14° |
| | | 20 | 1.182715 | 1.438895 | 1.813019 | 2.228134 | 2.68724 | 2.933307 |
| | | 30 | 2.031866 | 2.346818 | 2.807641 | 3.312599 | 3.853743 | 4.13258 |
| 40 | 37 | 0 | 0 | 0 | 0 | 0 | 0 | 0 |
| | | 10 | 0 | 0 | 0.015764 | 0.068987 | 0.173057 | 0.248826 |
| | | 20 | 0.159549 | 0.280477 | 0.517574 | 0.848691 | 1.272245 | 1.516329 |
| | | 30 | 0.99777 | 1.328607 | 1.810759 | 2.343774 | 2.937566 | 3.259846 |
| | 40 | 0 | 0 | 0 | 0 | 0 | 0.012069 | 0.028763 |
| | | 10 | 0.024055 | 0.063715 | 0.15795 | 0.315408 | 0.550102 | 0.69894 |
| | | 20 | 0.478773 | 0.699709 | 1.073703 | 1.534895 | 2.06121 | 2.34169 |
| | | 30 | 1.59735 | 1.961483 | 2.496404 | 3.09581 | 3.765141 | 4.126293 |
| | 43 | 0 | 0 | 0.000902 | 0.018893 | 0.066634 | 0.155471 | 0.219686 |
| | | 10 | 0.176016 | 0.289979 | 0.50643 | 0.804931 | 1.189269 | 1.413116 |
| | | 20 | 1.00145 | 1.317284 | 1.802494 | 2.336759 | 2.925202 | 3.241632 |
| | | 30 | 2.236584 | 2.643355 | 3.244484 | 3.915816 | 4.655278 | 5.048658 |
| | 46 | 0 | 0.040365 | 0.084876 | 0.183312 | 0.337873 | 0.559845 | 0.698887 |
| | | 10 | 0.549247 | 0.767782 | 1.132897 | 1.58144 | 2.107045 | 2.389286 |
| | | 20 | 1.719098 | 2.091459 | 2.635256 | 3.238633 | 3.905951 | 4.263614 |
| | | 30 | 2.953353 | 3.411141 | 4.080956 | 4.814922 | 5.601483 | 6.006779 |
| 50 | 37 | 0 | 0 | 0 | 0 | 0 | 0 | 0 |
| | | 10 | 0 | 0 | 0.021069 | 0.092205 | 0.231298 | 0.332566 |
| | | 20 | 0.213244 | 0.37487 | 0.691761 | 1.134312 | 1.70041 | 2.026639 |
| | | 30 | 1.333562 | 1.77574 | 2.420157 | 3.132555 | 3.926184 | 4.356925 |
| | 40 | 0 | 0 | 0 | 0 | 0 | 0.016131 | 0.038442 |
| | | 10 | 0.032151 | 0.085157 | 0.211107 | 0.421557 | 0.735235 | 0.934163 |
| | | 20 | 0.6399 | 0.935192 | 1.435051 | 2.051453 | 2.754897 | 3.12977 |
| | | 30 | 2.134928 | 2.621606 | 3.336552 | 4.137684 | 5.032273 | 5.514969 |
| | 43 | 0 | 0 | 0.001206 | 0.025251 | 0.089059 | 0.207794 | 0.29362 |
| | | 10 | 0.235253 | 0.38757 | 0.676865 | 1.075825 | 1.589509 | 1.888691 |
| | | 20 | 1.338481 | 1.760608 | 2.409111 | 3.12318 | 3.909659 | 4.332582 |
| | | 30 | 2.989292 | 3.532958 | 4.336393 | 5.233657 | 6.221981 | 6.74775 |
| | 46 | 0 | 0.05395 | 0.113441 | 0.245004 | 0.451582 | 0.748257 | 0.934092 |
| | | 10 | 0.734092 | 1.026173 | 1.514166 | 2.113663 | 2.816157 | 3.193384 |
| | | 20 | 2.297649 | 2.795325 | 3.522133 | 4.328573 | 5.220472 | 5.698505 |
| | | 30 | 3.947284 | 4.559138 | 5.454375 | 6.435351 | 7.486625 | 8.02832 |

Figure 4:
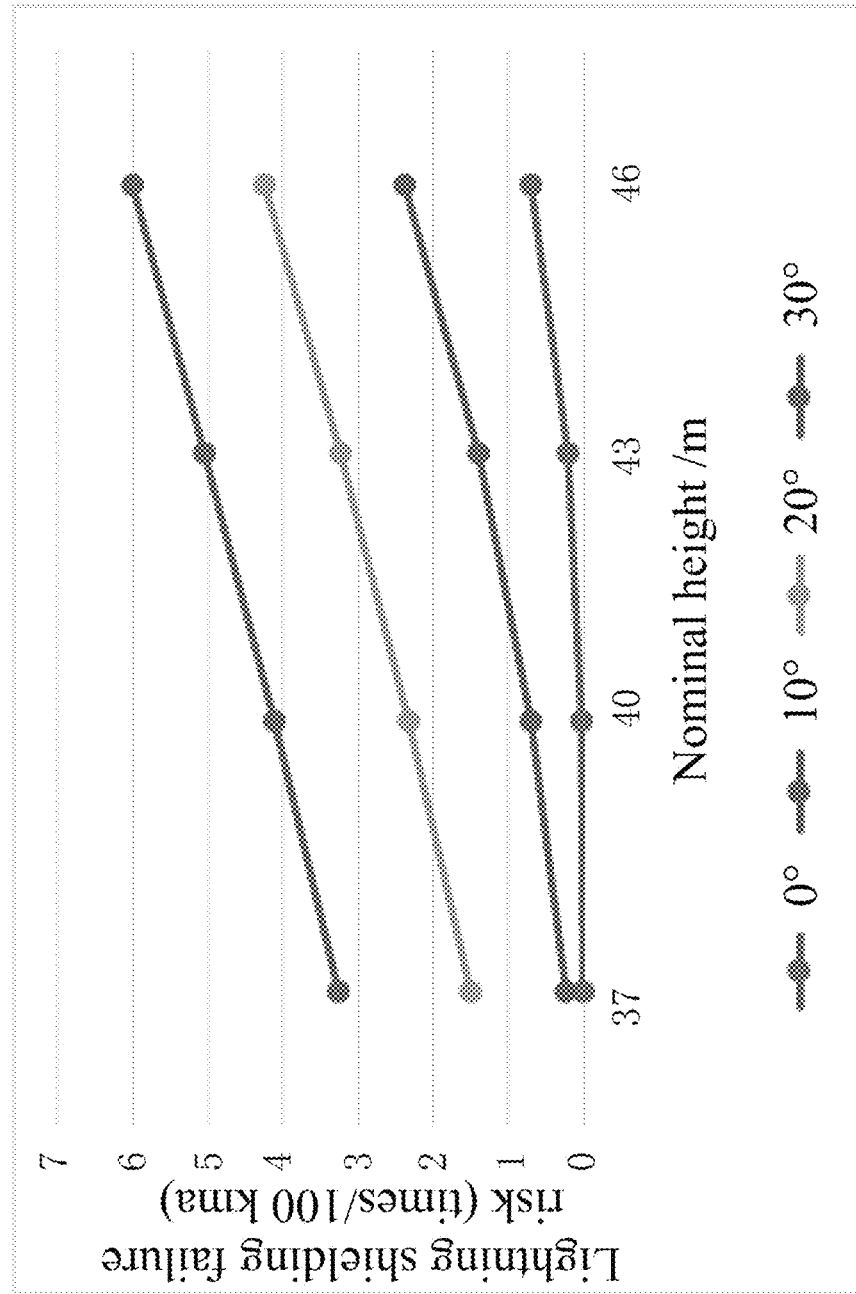
FIG. 4 is a characteristic diagram of a nominal height and a lightning shielding failure risk according to the present disclosure.

Lightning shielding failure risks under different nominal heights when the quantity of thunderstorm days is 40, the protection angle is 14°, and the inclination angles of the ground are 0°, 10°, 20° and 30° are analyzed to obtain characteristics of the nominal height and the lightning shielding failure risk, as shown in FIG. 4.

Figure 5:
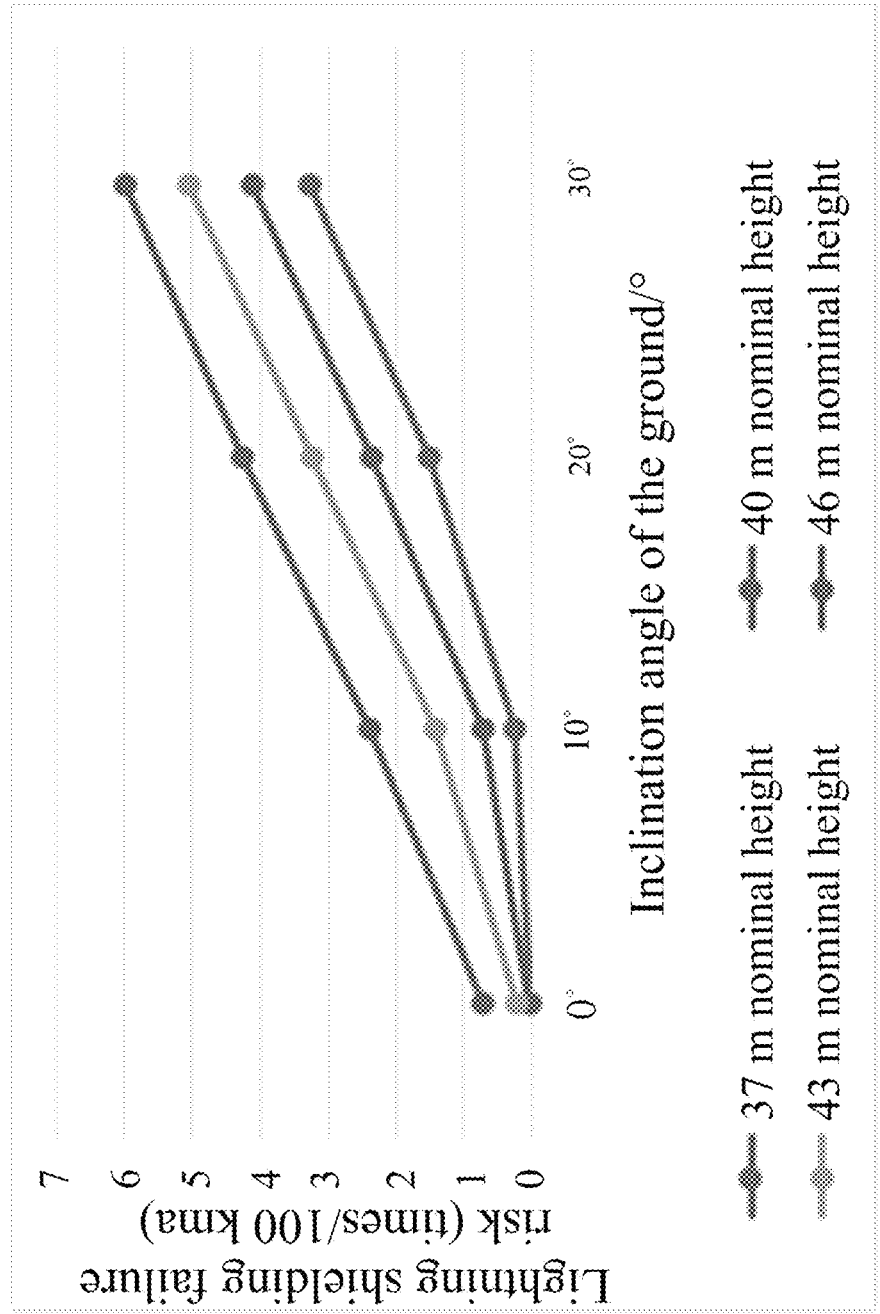
FIG. 5 is a characteristic diagram of an inclination angle of the ground and a lightning shielding failure risk according to the present disclosure.

Lightning shielding failure risks under different terrains (inclination angles of the ground) when the quantity of thunderstorm days is 40, the protection angle is 14°, and the nominal heights are 37 m, 40 m, 43 m, and 46 m are analyzed to obtain characteristics of the inclination angle of the ground and the lightning shielding failure risk, as shown in FIG. 5.

Figure 6:
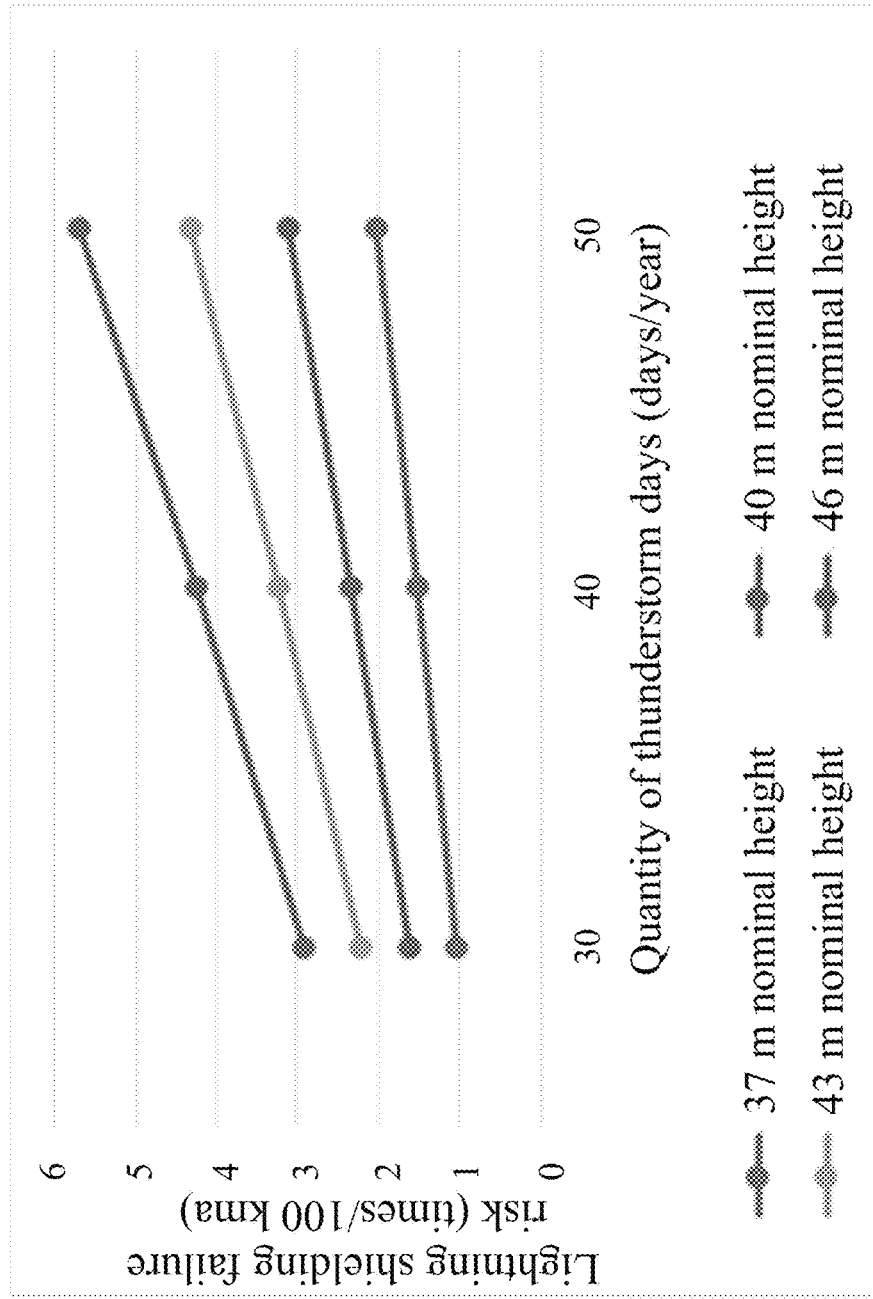
FIG. 6 is a characteristic diagram of a quantity of thunderstorm days and a lightning shielding failure risk according to the present disclosure.

Lightning shielding failure risks under different quantities of thunderstorm days when the inclination angle of the ground is 20°, the protection angle is 14°, and the nominal heights are 37 m, 40 m, 43 m, and 46 m are analyzed to obtain characteristics of the quantity of thunderstorm days and the lightning shielding failure risk, as shown in FIG. 6.

Figure 7:
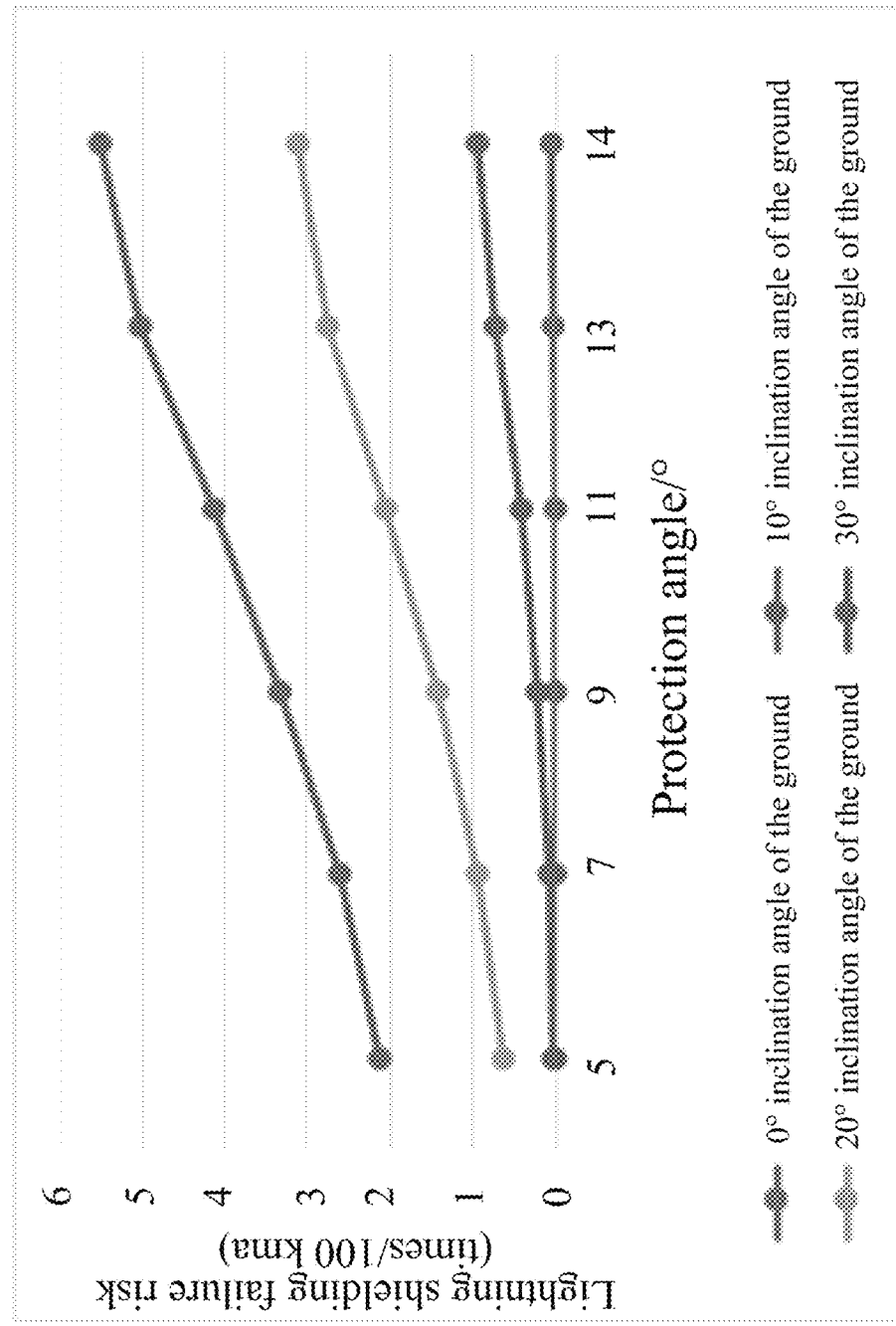
FIG. 7 is a characteristic diagram of a protection angle and a lightning shielding failure risk according to the present disclosure.

Lightning shielding failure risks under different protection angles when the nominal height is 40 m, the quantity of thunderstorm days is 50, and the inclination angles of the ground are 0°, 10°, 20° and 30° are analyzed to obtain characteristics of the protection angle and the lightning shielding failure risk, as shown in FIG. 7.

Based on operation and maintenance and monitoring data provided by the line department, it is obtained that the quantity of thunderstorm days of the whole line is 40 (days/year), the ground wire protection angle is 14°, and weights B; and di are shown in Table 2 and Table 3.

TABLE 2

Proportions of nominal heights of various towers

| SN j | Nominal height $h_j$/m | $\beta_j$/% |
|---|---|---|
| 1 | 37 | 93.9 |
| 2 | 40 | 6.1 |
| 3 | 43 | 0 |
| 4 | 46 | 0 |

TABLE 3

Proportions of various terrains

| SN i | Inclination angle of the ground $\varphi_i$/° | Corresponding terrain | $\alpha_i$/% |
|---|---|---|---|
| 1 | 0 | River network and quagmire | 11.03 |
| 2 | 10 | Plain and hilly land | 16.22 |
| 3 | 20 | Mountainous area | 32.65 |
| 4 | 30 | High mountain | 40.10 |

A lightning shielding failure risk of the existing whole line is calculated, and lightning shielding failure risks of the whole line under different protection angles are analyzed. Calculation results are shown in Table 4, which can provide guidance for operation and maintenance of the current line and setting of a protection angle of a new line in the same area in the future.

TABLE 4 lightning shielding failure risks of the whole line under different protection angles

| Protection angle/° | Lightning shielding failure risk of the whole line/ (100 km*year) |
|---|---|
| 14 (actual protection angle of the line) | 1.660 |
| 11 | 1.263 |
| 9 | 0.927 |
| 7 | 0.649 |
| 5 | 0.474 |

To sum up, the method provided in the present disclosure can quickly analyze the tripping risk of the whole line due to the lightning shielding failure through weighted averaging of the typical combination, so as to provide an effective suggestion for lightning protection of the line and achieve good accuracy and objectivity.

The above described are only specific implementations of the present disclosure, which do not constitute a limitation on the protection scope of the present disclosure. Those skilled in the art should understand that the present disclosure includes but is not limited to the content described in the above specific implementations. Any modification without departing from the functional and structural principles of the present disclosure fall within the scope of the claims.

The invention claimed is:

1. A method for providing an additional lightning protection measure of a whole transmission line, comprising:
    performing a quantitative analysis on a tripping risk of a whole line due to a lightning shielding failure according to a multi-dimensional analysis method for a tripping risk of a whole transmission line due to a lightning shielding failure;
    identifying a weak link of the whole line based on a lightning shielding failure risk value; and
    providing the additional lightning protection measure for the weak link;
    wherein the multi-dimensional analysis method for a tripping risk of a whole transmission line due to a lightning shielding failure comprises the following steps:
    step 1: extracting a size parameter of a main tower head, an insulation configuration for a line, a quantity of monitored thunderstorm days, and an average altitude for the line, and calculating a ground wire protection angle, a striking distance, and a corrected insulator flashover voltage by a processor;
    step 2: setting an analysis group based on the protection angle, a terrain, a nominal height, and the quantity of thunderstorm days, and calculating the lightning shielding failure risk value of the line in each case based on a shielding principle of the transmission line by the processor;
    step 3: analyzing, based on a calculation result in step 2, main factors affecting a lightning shielding failure risk of the line, and selecting a typical combination of a tower protection angle, the terrain, the nominal height, and the quantity of thunderstorm days based on an existing terrain proportion or a ground wire protection angle setting collected for the transmission line by the processor; and
    step 4: extracting a weight of the selected typical combination of the tower protection angle, the terrain, the nominal height, and the quantity of thunderstorm days in step 3 based on a terrain proportion and tower usage of a whole line in a same area, and performing a quantitative analysis on a tripping risk of the whole line due to a lightning shielding failure by the processor;
    wherein in step 4, the tripping risk of the whole line due to the lightning shielding failure is analyzed through weighted averaging of the typical combination:

$$SFF_{eq} = \sum_{j=1}^{4} \beta_j \left( \sum_{i=1}^{4} \alpha_i SFF_{\varphi_i, h_j}^{\theta} \right)$$

wherein $h_j$ represents a height of a $j^{th}$ type of tower; $\beta_j$ represents a proportion of a tower whose nominal height is $h_j$; $SFF_{\varphi_i, h_j}^{\theta}$ represents a lightning shielding failure risk when the tower protection angle is $\theta$, the nominal height is $h_j$, and an inclination angle of the ground is $\varphi_i$; $\alpha_i$ represents a proportion of a section corresponding to a terrain whose inclination angle of the ground is $\varphi_i$ to the whole line; and $SFF_{eq}$ represents the lightning shielding failure risk of the whole line; and wherein the lightning shielding failure risk value of the line in each case of the typical combination is sorted by the processor to obtain a high-risk typical combination, in the line, a link whose nominal height, terrain, quantity of thunderstorm days, and protection angle are closer to the high-risk typical combination is the weak link.

2. The method for providing an additional lightning protection measure of a whole transmission line according to claim 1, wherein the calculating a ground wire protection angle, a striking distance, and a corrected insulator flashover voltage in step 1 comprises the following steps:
    step 1.1: calculating the ground wire protection angle according to the following formula, wherein the ground wire protection angle reflects a spatial position relationship between a conductor and a ground wire, and is determined by a spacing between tower crossarms, a length of a crossarm, an insulator string configuration, and a ground wire support:

$$\theta = \arctan\left( \frac{S_C - S_G}{h_1 + h_G - l_G + l_C} \right)$$

wherein $S_C$ represents a length of a crossarm of the conductor, $S_G$ represents a length of a crossarm of the ground wire, $h_1$ represents a distance between the crossarm of the conductor and the ground wire support, $h_G$ represents a height of the ground wire support, $l_G$ represents a length of a ground wire string, and $l_C$ represents a length of a conductor string;

step 1.2: calculating striking distances of the conductor, the ground wire, and the ground according to the following formulas, wherein the striking distance is a critical breakdown distance between a head of a lightning charge leader in the air and a ground struck by lightning, or between the head of the lightning charge leader in the air and an object on the ground, a higher potential of the head of the leader leads to a longer striking distance, and the potential is determined by a lightning current amplitude:

$$r_s = 10I^{0.65}$$
$$r_c = 1.63(5.015I^{0.578} - 0.001U_{DC})^{1.125}$$
$$r_g = \begin{cases} [3.6 + 1.7\ln(43 - h_{c.av})]I^{0.65} & h_{c.av} < 40m \\ 5.5I^{0.65} & h_{c.av} \geq 40m \end{cases}$$

wherein $r_s$ represents a striking distance between the leader and the ground wire, I represents the lightning current amplitude, $r_c$ represents a striking distance between the leader and the conductor, $U_{DC}$ represents a voltage level of the transmission line, $r_g$ represents a striking distance between the leader and the ground, and $h_{c.av}$ represents an average height of the conductor relative to the ground; and step 1.3: introducing an altitude correction factor, wherein the insulator flashover voltage is a key index for determining whether a flashover tripping occurs, no flashover occurs when insulation performance is good enough to withstand lightning impulse, and the insulator flashover voltage is affected by the altitude:

$$U_{50\%} = (533L + 132)\frac{1}{1.1 - H/10000}$$

wherein L represents a dry-arcing distance of an insulator, H represents the altitude, and $U_{50\%}$ represents an absolute value of 50% flashover voltage of the insulator.

3. The method for providing an additional lightning protection measure of a whole transmission line according to claim 2, wherein the lightning current amplitude is calculated according to a recommended probability of the lightning current amplitude in GB/T50064-2014 Code for Design of Overvoltage Protection and Insulation Coordination for AC Electrical Installations and the following formulas:

wherein when the quantity of thunderstorm days is greater than 20, the following formula is used:

$$P(I_0 \geq i_0) = 10^{-\frac{i_0}{88}}$$

when the quantity of thunderstorm days is less than or equal to 20, the following formula is used:

$$P(I_0 \geq i_0) = 10^{-\frac{i_0}{44}}$$

wherein $P(I_0 \geq i_0)$ represents a probability that the lightning current amplitude exceeds $i_0$, $I_0$ represents a variable of the lightning current amplitude, and $i_0$ represents a given lightning current amplitude.

4. The method for providing an additional lightning protection measure of a whole transmission line according to claim 1, wherein a tripping risk of the typical combination of the tower protection angle, the terrain, the nominal height, and the quantity of thunderstorm days due to the lightning shielding failure is calculated and analyzed based on a discharge mechanism of a lightning leader and an equivalence circuit diagram of the lightning shielding failure, which specifically comprises the following steps:

step 3.1: fitting a probability distribution of a lightning strike angle according to a following formula, wherein an occurrence mechanism of the lightning shielding failure on the line shows that the strike angle is randomly distributed when the lightning charge leader reaches near the line:

$$g(\psi) = K_m \cos^m(\psi)$$

wherein $g(\psi)$ represents a probability that the strike angle of the lightning charge leader is; $\psi$; and $K_m$ represents a normalization coefficient and needs to meet a following formula:

$$\int_{-\frac{\pi}{2}}^{\frac{\pi}{2}} g(\psi)d\psi = 1;$$

step 3.2: obtaining an exposure arc of the conductor based on a circle centered on the conductor and with a radius being a striking distance of the conductor, within a ground wire protection range and a striking distance protection range of the ground, and then calculating an exposure distance of the conductor according to the following formula, wherein the lightning shielding failure occurs on the line when the lightning charge leader is in the exposure arc of the conductor:

$$X = \int_{\theta_1}^{\theta_2} \int_{\psi_1(\theta)}^{\psi_2(\theta)} \frac{r_s \sin(\theta - \psi)}{\cos\psi} g(\psi)d\psi d\theta$$

wherein X represents the exposure distance of the conductor, $r_s$ represents a striking distance between the leader and the ground wire, $\theta_1$ represents a horizontal included angle at an intersection point of the ground protection range and the exposure circle of the conductor, $\theta_2$ represents a horizontal included angle at an intersection point of the ground wire protection range and the exposure circle of the conductor, $\psi_1(\theta)$ represents a minimum included angle of a horizontal included angle of a leading process of lightning, and $\psi_2(\theta)$ represents a maximum included angle of a horizontal included angle of a leading process of lightning;

step 3.3: analyzing a lightning resisting level of line insulation by using an equivalent circuit of the lightning shielding failure of which wave impedance of the conductor is connected in series to a voltage source of the line and then connected in parallel to wave impedance of a lightning channel, and calculating, according to the following formula, a lightning voltage applied to a discharge channel at the moment of the lightning shielding failure:

$$U_A = \frac{Z_0}{Z + 2Z_0}(IZ + 2U_{AC})$$

wherein $Z_0$ represents the wave impedance of the lightning channel, Z represents the wave impedance of the conductor, I represents a lightning current amplitude, $U_{AC}$ represents a voltage of the transmission line to the ground, and $U_A$ represents the lightning voltage applied to the discharge channel; and there is a corresponding relationship between equivalent wave impedance of the lightning channel and the lightning current amplitude, $Z_0$ is obtained based on a characteristic curve of the equivalent wave impedance of the lightning channel and the lightning current amplitude after the lightning current amplitude is determined, and the lightning resisting level is calculated based on an occurrence criterion of the lightning shielding failure, wherein the lightning shielding failure occurs when $U_A \geq U_{50\%}$:

$$I_c \geq \frac{Z+2Z_0}{Z_0 Z}\left(U_{50\%} - \frac{2Z_0 U_{AC}}{Z+2Z_0}\right);$$

and wherein U 50% represents an absolute value of 50% flashover voltage of the insulator;

step 3.4: calculating the lightning shielding failure risk value of the line in each case of the typical combination according to the following formula:

$$SFF = \frac{2N_g}{10} \int_{I_C}^{I_{max}} XP'(I)dI$$

wherein SFF a lightning shielding failure risk value of the line, $N_g$ represents a ground flash density in this area, X represents the exposure distance of the conductor, I represents the lightning current amplitude, $I_c$ represents a lightning resisting level of the transmission line, and $I_{max}$ represents an upper limit of the lightning current amplitude, P'(I) represents a probability density function of lightning current amplitude; and sorting the lightning shielding failure risk value of the line in each case of the typical combination to obtain a high-risk typical combination.

* * * * *